United States Patent
Menon et al.

(10) Patent No.: US 9,535,117 B2
(45) Date of Patent: Jan. 3, 2017

(54) SYSTEM DEBUG USING AN ALL-IN-ONE CONNECTOR

(71) Applicant: Intel Corporation, Santa Clara, CA (US)

(72) Inventors: Sankaran M. Menon, Austin, TX (US); Rolf Kuehnis, Vesilahti (FI)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 14/669,693

(22) Filed: Mar. 26, 2015

(65) Prior Publication Data

US 2016/0259005 A1    Sep. 8, 2016

Related U.S. Application Data

(60) Provisional application No. 62/129,399, filed on Mar. 6, 2015.

(51) Int. Cl.
*G06F 11/00* (2006.01)
*G01R 31/317* (2006.01)
*G01R 31/3177* (2006.01)

(52) U.S. Cl.
CPC ..... *G01R 31/31705* (2013.01); *G01R 31/3177* (2013.01)

(58) Field of Classification Search
CPC ................. G06F 11/22; G06F 11/2294; G01R 31/31705; G01R 31/3177; G01R 31/31903; G01R 31/31905
See application file for complete search history.

(56) References Cited

U.S. PATENT DOCUMENTS

| 6,185,732 B1* | 2/2001 | Mann | G06F 11/3636 |
| | | | 712/227 |
| 2007/0168746 A1* | 7/2007 | Righi | G06F 11/3656 |
| | | | 714/38.11 |
| 2013/0124934 A1* | 5/2013 | Jones | G01R 31/318547 |
| | | | 714/727 |
| 2014/0366153 A1 | 12/2014 | Yoon | |
| 2015/0067428 A1* | 3/2015 | Singer | G06F 11/27 |
| | | | 714/729 |

(Continued)

FOREIGN PATENT DOCUMENTS

CN    101713694 A    5/2010

OTHER PUBLICATIONS

Hewlett-Packard Company et al., "Universal Serial Bus Type-C Cable and Connector Specification Revision 1.0," Release 1.0, Aug. 11, 2014, 171 pages, (http://www.those.ch/designtechnik/wp-content/uploads/2014/08/USB-Type-C-Specification-Release-1.0.pdf), See pp. 101 and 104-106.

(Continued)

*Primary Examiner* — Michael Maskulinski
(74) *Attorney, Agent, or Firm* — International IP Law Group, P.L.L.C.

(57) ABSTRACT

Techniques of debugging a computing system are described herein. The techniques may include an apparatus having an all-in-one port. The all-in-one port may include a configuration channel and a sideband channel. The sideband channel is configured to default to a debug mode when the configuration channel is not communicatively coupled to an external device.

25 Claims, 16 Drawing Sheets

(56) References Cited

U.S. PATENT DOCUMENTS

2015/0127983 A1* 5/2015 Trobough ............. G06F 11/267
714/30
2016/0170929 A1* 6/2016 Pethe .................... G06F 13/102
710/313
2016/0187420 A1* 6/2016 Trethewey ......... G01R 31/3177
714/727

OTHER PUBLICATIONS

Hewlett-Packard Company et al., "Universal Serial Bus 3.1 Specification Revision 1.0," Jul. 26, 2013; 631 pages, (http://www.usb.org/developers/docs/), See section 5.5.
Vesa et al., "VESA DisplayPort Alt Mode for USB Type-C Standard," Sep. 22, 2014, 17 pages, (http://www.displayport.org/wp-content/uploads/2014/09/DP-Alt-Mode-Overviewfor-VESA-v1.pdf), See pp. 8-12.
International Search Report and Written Opinion for International PCT Application No. PCT/US2016/017008 dated May 24, 2016, 11 pages.

* cited by examiner

| Plug Pin | USB Name | Mode 0 (No Special-Mode Support or only SBU debug) | Mode 1 (JTAG/etc) | Mode 2 (UART & HS) | Mode 3-7 Vendor |
|---|---|---|---|---|---|
| A5/B5 | CC1/CC2 | Not Connected | Not Connected | Not Connected | Not Connected |
| A6/B6 | D+ | Tri-state | TDI | HighSpeed | Vendor |
| A7/B7 | D- | Tri-state | TDO | HighSpeed | Vendor |
| A8 | SBU1 | Optional TMSC/SWDIO | TMSC/SWDIO | UART TX | Vendor |
| B8 | SBU2 | Optional TCK/SWDClk | TCK/SWDClk | UART RX | Vendor |
| A2/A3 | TX+1/TX-1 | Tri-state | MIPI PTI <0> MIPI PTI <1> | MIPI PTI <0> MIPI PTI <1> | Vendor Vendor |
| B10/B11 | RX-1/RX+1 | Tri-state | MIPI PTI <2> MIPI PTI <3> | MIPI PTI <2> MIPI PTI <3> | Vendor Vendor |
| B2/B3 | TX+2/TX-2 | Tri-state Thus, Mode=0 | MIPI PTI CLK Mode <0> | MIPI PTI CLK Mode <0> | Vendor Mode <0> |
| A10/A11 | RX-2/RX+2 | | Mode <1> Mode <2> | Mode <1> Mode <2> | Mode <1> Mode <2> |

| Plug Pin | USB Name | Secondary Mode 0 | Secondary Mode 1 | Secondary Mode 2 | Secondary Mode 3 |
|---|---|---|---|---|---|
| A5/B5 | CC1/CC2 | Not Connected | Not Connected | Not Connected | Not Connected |
| A6/B6 | Dp | Hi-Speed USB (UFP) Func. (for DnX downloads etc.) | Hi-Speed USB (UFP) Func. (for DnX downloads etc.) | Hi-Speed USB (UFP) Func. (for DnX downloads etc.) | Hi-Speed USB (UFP) Func. (for DnX downloads etc.) |
| A7/B7 | Dn | | | | |
| A8 | SBU1 | UART_TX UART_RX | | TMSC TCKC | |
| B8 | SBU2 | | | | |
| A2/A3 | Txp1/TXn1 | SS USB (UFP) Functional or DvC or Debug Tracing | MIPI PTI <0> MIPI PTI <1> | SS USB (UFP) Functional or DvC or Debug Tracing | MIPI PTI <0> MIPI PTI <1> |
| B10/B11 | Rxn1/RXp1 | | MIPI PTI <2> MIPI PTI <3> | | MIPI PTI <2> MIPI PTI <3> |
| B2/B3 | Txp2/TXn2 | SS USB (UFP) Functional or DvC or Debug Tracing | MIPI PTI CLK Mode <0>=1 | SS USB (UFP) Functional or DvC or Debug Tracing | MIPI PTI CLK Mode <0>=1 |
| A10/A11 | Rxn2/RXp2 | | | | |

SYSTEM DEBUG USING AN ALL-IN-ONE CONNECTOR

CROSS REFERENCE TO RELATED APPLICATIONS

The present application claims the benefit of U.S. Provisional Patent Application No. 62/129,399, filed Mar. 6, 2015, which is incorporated herein by reference.

TECHNICAL FIELD

This disclosure relates generally to techniques for debugging a computing device. Specifically, this disclosure relates to debugging of a computing device having an all-in-one connector.

BACKGROUND ART

Computing systems may include integrated circuits, systems on a chip (SOCs), and other circuit components configured to integrate multiple microcontrollers. Components of computing system may encounter errors. For example, each of the microcontrollers within a given may have their own firmware components as well as their own operating system driver components. Many of these microcontroller firmware and driver components may encounter errors that may need to be debugged.

In computing devices, debugging may include a process of finding and reducing bugs, or defects, in a computer program or a piece of electronic hardware, as well as increase performance of a computing platform. In some cases, debug may be performed when a chassis of a computing device is opened, and debugging interfaces are exposed. Debugging may tend to increase in difficulty when a computing device has a closed chassis.

BRIEF DESCRIPTION OF THE DRAWINGS

FIG. 3 illustrates a table having pin assignments for an all-in-one port.

FIG. 4 illustrates a table having pin assignments for an all-in-one port in a secondary debug mode.

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

The present disclosure relates generally to techniques for debug control and communication as well as for gathering debug traces using an all-in-one port. An all-in-one port may provide a power interface, may be at least partially or fully reversible, and may include general data interfaces as well as additional data-specific interfaces such as a display interface, an audio interface, and the like.

An example of an all-in-one port may include a Universal Serial Bus (USB) "Type C" connector, indicated in a specification standard entitled, "USB Type-C Cable and Connector Specification Revision 1.0, Aug. 11, 2014," referred to herein as the "USB Type-C specification." As discussed in more detail below, the USB Type-C connector may include a reversible plug connector that may be used at both a host computing device and a peripheral computing device. Other all-in-one ports may be implemented in the debug techniques described herein. However, for simplicity, the all-in-one port may be interchangeably referred to herein as or as simply an all-in-one port in general or as an USB Type-C connector.

All-in-one ports, such as the USB Type-C connector, may be adopted in multiple compute and connect platforms. The techniques described herein include debug access from the Type-C interface as a way to debug computing systems and devices.

Typically, in an open chassis scenario, general purpose input output (GPIO) pins on a computing platform enable a debug device to be communicatively coupled to the GPIO pins for gathering debug trace data. In a closed chassis scenario, a debug device may be limited in a type and kind of pins available for communicative coupling, thereby reducing speed and accessibility of gathering debug trace data. The techniques described herein include various method of communicatively coupling a debug device to a computing device via an all-in-one port to provide relatively higher gathering of debug trace data.

Further, the techniques described herein include a debug special mode (DSM). An all-in-one connector, such as the USB Type-C connector, may communicatively couple to a device to be tested. The DSM may provide a port-agnostic scheme for debug communication with the tested device. For example, in the USB Type-C specification, a debug accessory mode (DAM) may be entered for a device acting as a downward facing port (DFP) or a dual role port (DRP).

However, DAM may not be entered by a device that is acting as an upward facing port (UFP). The DSM techniques described herein enable debug for not only devices acting as DFPs and DRPs, but also UFPs. UFP mode may be a likely scenario for some computing devices such as mobile devices. Therefore, DSM may be useful for tablets, smartphones, Internet of Things (IOT) devices, and the like, as well as networked computing systems including client devices and server devices.

Figure 1:
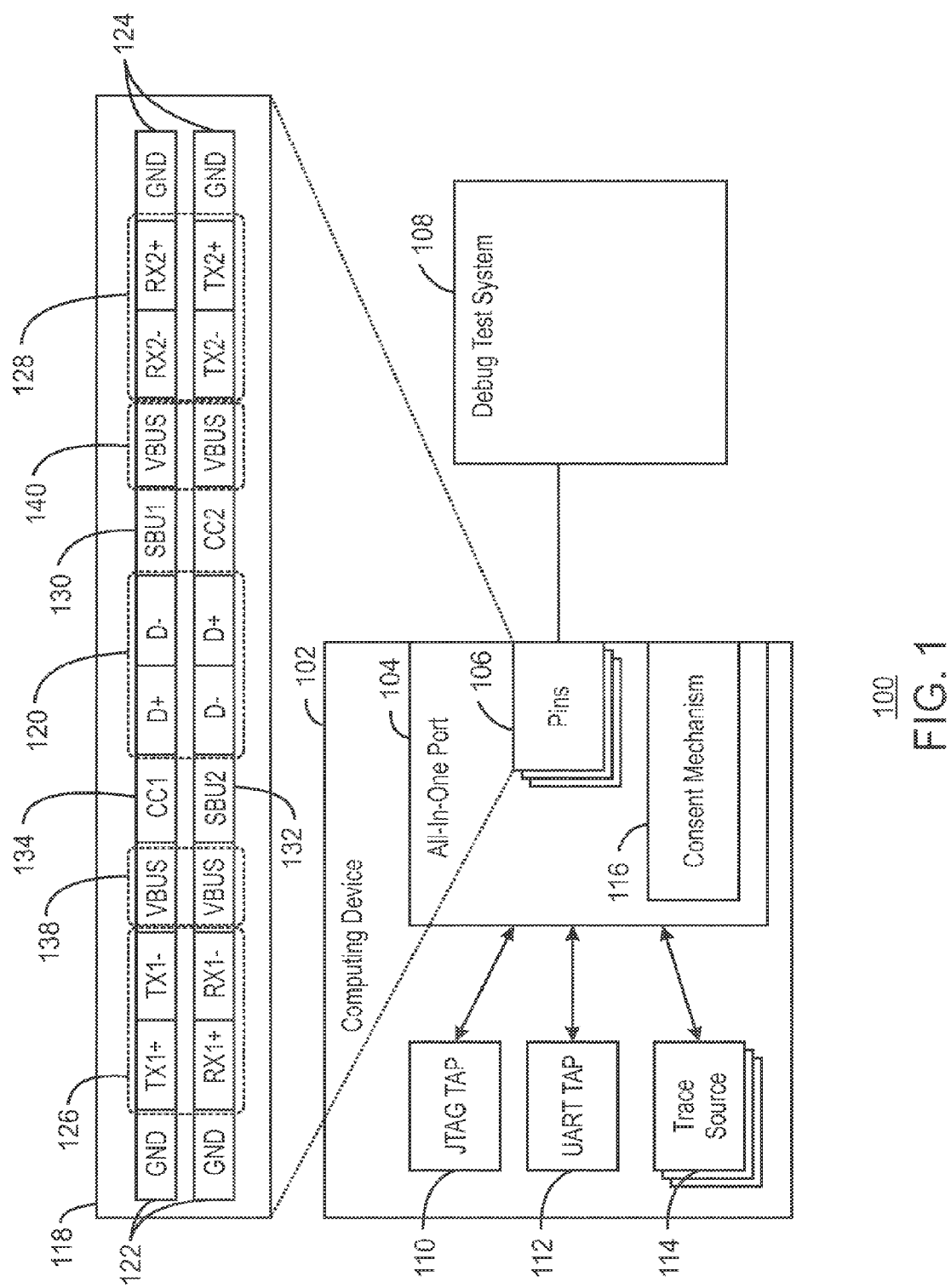
FIG. 1 illustrates a computing system having an all-in-one port to be communicatively coupled to a debugging system.

FIG. 1 illustrates a computing system having an all-in-one port to be communicatively coupled to a debugging system. The computing system 100 may include a computing device 102 including an all-in-one port 104 having a plurality of pins 106. The pins 106 of the all-in-one port 104 may be configured to communicatively couple to a debug test system 108. The debug test system 108 may be configured to run one or more types of debugging operations at test access ports (TAPs), such as a Joint Test Action Group (JTAG) TAP 110, a universal asynchronous receiver/transmitter (UART) TAP 112, or any other type of debug TAP or Test Access Mechanisms (TAMs). Although the computing device 102 of FIG. 1 illustrates both JTAG TAP 110 and UART 112, the computing device 102 may include any combination of the TAPs shown, as well as any other type of port configured to provide access for generating debug trace data from trace sources 114, as well as any port for running a debug control process such as debug access port (DAP) that is not necessarily JTAG based. Trace data from the trace sources 114 may include trace statements indicating flow of execution processes for various components (not shown) of the computing device 102. The trace data may be provided from the trace sources 114 through the all-in-one port 104 to the debug test system 108.

The all-in-one port 104 may employ a consent mechanism 116. The consent mechanism 116 may be logic, such as hardware logic. In some cases, the consent mechanism 116 is a soft-fuse such as a pin-strap, non-volatile memory bit, register bits, or the like. In any case, the consent mechanism may be configured to identify and verify a given debug test system, such as the debug test system 108 is authorized to perform debug operations at the computing device 102. In some cases, the consent mechanism 116 may prevent an unrecognized debug device from driving operations through the pins 106. As discussed in more detail below, the techniques described herein also include harm reduction enabled by advertising debug modes that are supported at the computing device 102, enabling initial connectors to be configured as "input only" to avoid causing potential damage to the debug system 108 in an at least partially "fail-safe" manner.

As discussed above, the all-in-one port 104 may be implemented as a USB Type-C connector having pins 106, enumerated in the enlarged box 118. The USB Type-C connector 118 is an at least partially reversible plug connector. As indicated at the dashed box 120, data lines D+ and D− may be disposed on a top half of the USB Type-C connector 118 and on a bottom half of the connector such that they are diametrically opposed. The arrangement of the data lines at 120 provides reversible functionality such that a plug may be received in either a right side up or an upside down disposition at the USB Type-C connector 118.

In general the USB Type-C connector 118 may be used at both a host computing device, such as the computing device 102, and a peripheral computing device, such as the debug test system 108. As illustrated in FIG. 1, the USB Type-C connector 118 may include a 24-pin double-sided connector interface providing four power/ground pairs 122 and 124, two differential pairs for USB 2.0 high speed (HS) data bus indicated at box 120, four pairs for super-speed (SS) data bus indicated at the dashed boxes 126 and 128, two "sideband use" pins indicated at 130 and 132, two configuration pins for cable orientation detection indicated at 134 and 136 which may be dedicated biphase mark code (BMC) configuration data channel pins, and power interface pins (Vbus) indicated by the dashed boxes 138 and 140.

The sideband use (SBU) pins may include SBU1 130 and SBU2 132. In some cases, the SBU1 130 and SBU2 132 may be pins reserved for future use. The techniques described herein include setting the SBU1 130 and SBU2 132 to default to a debug mode when the configuration channel (CC) pins CC1 134 and CC2 136 are open, or otherwise not communicatively coupled to an external computing device, such as the debug test system 108. When CC1 134 and CC2 136 are open the SBU1 130 and SBU2 132 default to a mode, referred to herein as "debug special mode" (DSM).

In DSM the computing device 102 may be debugged and may enter multiple submodes associated with any given debug protocol such as JTAG, UART, and the like. Further, in contrast to a Debug Accessory Mode (DAM) associated with the USB Type-C specification, the computing device 102 may enter DSM while being agnostic to whether the computing device 102 is an Upward Facing Port (UPF). More specifically, while DAM requires that the computing device 102 is either a Downward Facing Port (DFP) or a Dual Role Port (DRP), the techniques described herein include the DSM mode wherein the computing device may enter debug modes even as an UPF.

Further, there may be a primary mode associated with initial entering of DSM. A secondary DSM may be entered from the primary DSM. In secondary DSM, the all-in-one port 104 may be configured to conduct debug operations, communicate non-debug data, such as audio, video, and the like, or any combination thereof. Entering DSM may also be done during a boot stage, or startup of the computing device 102 before an operating system associated with the computing device 102 has initialized operation. Therefore, the DSM may be lower latency and used in early stage operation in comparison to other debug mode states such as DAM which requires operating system functionality. For example, the DSM may be available after reset without involvement of software, firmware, or any combination thereof. In addition, hot-swapping of a Type-C cable when in DSM may be enabled.

The DSM does not preclude other types of traditional USB Type-C operation. For example, if a standard USB Type-C cable is communicatively coupled to the USB Type-C connector 118 including any accessory or alternate modes such as display, audio, and the like, a corresponding USB Type-C functionality may be switched on.

DSM may also incorporate one or more fail-safe features. For example, a fail-safe feature may include advertisement of a mode, such as the DSM by the computing device 102. If the debug testing system 108 does not support the advertised mode, then the debug testing system 108 will not drive any pins 106. Further, the SBU1 130 and SBU2 132 may be configured to be input only, thereby reducing potential damage that may occur if the pins were output driving pins when the debug testing system 108 is communicatively coupled. As another example, the DSM may only be entered with consent of the computing device 102 be detecting an identification code indicating a supported and authentic debugging protocol.

Figure 2:
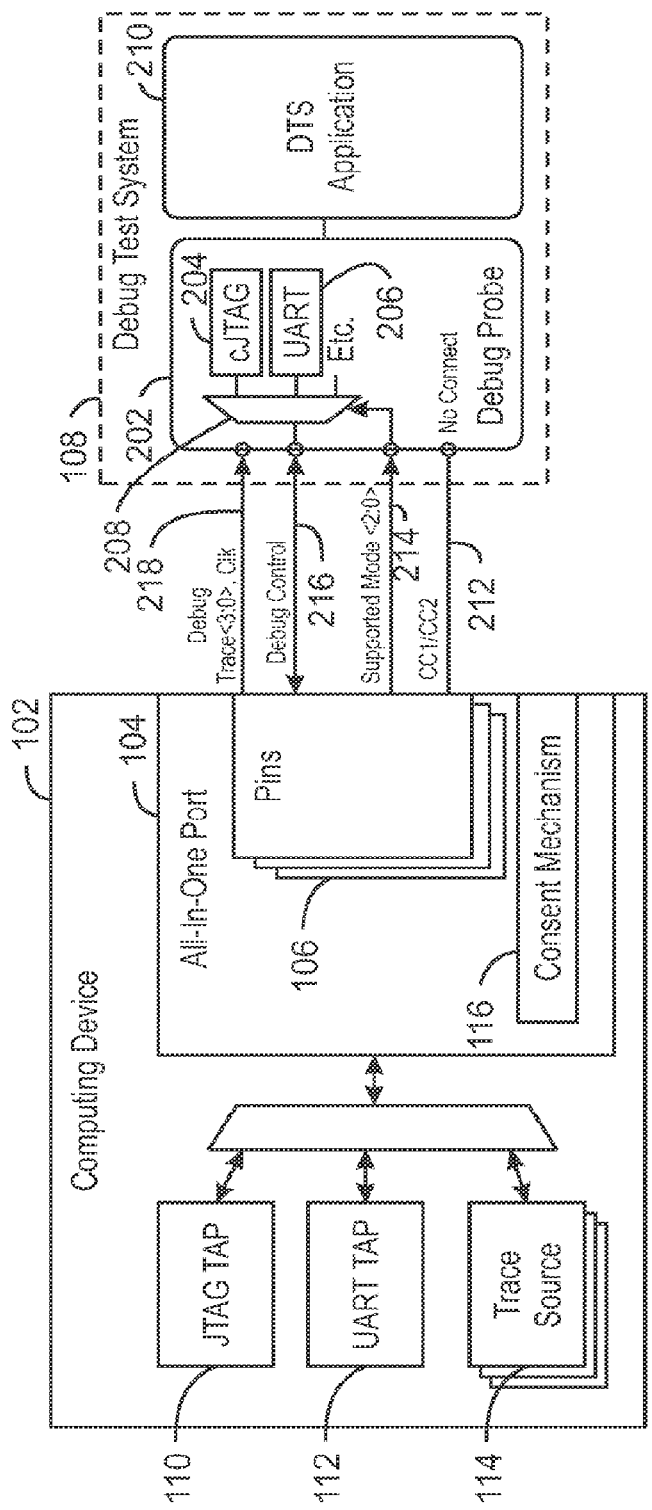
FIG. 2 illustrates components of the debugging system communicatively coupled to pins of a computing system having an all-in-one port.

FIG. 2 illustrates components of the debugging system communicatively coupled to pins of a computing system having an all-in-one port. A debug test system, such as the debug test system 108 of FIG. 1, may include a debug probe 202 having various debug modules, such as a compact JTAG (cJTAG) module 204, a UART module 206, and the like. A multiplexer 208 may switch between the debug modules 204 and 206. A debug test system (DTS) application 210 may be a coded instruction set, such as software, related to operations of any given debug protocol supported by the debug test system 108.

As illustrated at 212, when the debug test system 108 is communicatively coupled to the all-in-one port 102, the CC1 134 and CC2 136 are not connected to any driving voltage or data. A supported mode is advertised at 214. As discussed in more detail below, the supported modes are modes supported by the computing device 102. Debug control 216 and debug trace 218 may be provided over pins 106, such as the SBU1 130 and SBU2 132. Debug traces are shown being sent from the computing device 102, also referred to herein as a Target System (TS), via the all-in-one port 104 to the DTS application 210 via the debug trace line 218.

FIG. 3 illustrates a table having pin assignments for an all-in-one port. The table 300 DSM and submodes included within DSM. From a tri-state mode, or submode zero indicated in the column 302, configuration channels, such as the CC1 134 and CC2 136 of FIG. 1, are not connected while debug signaling such as Test Serial Data (TMSC), a two-pin run control solution such as Serial Wire Debug Input/Output (SWDIO), a serial wire debug (SWD), an Institute of Electrical and Electronics Engineers (IEEE) two-wire debug solution, and the like, Test Clock (TCK), SWD clock (SWDClk), and the like may be provided over the SBU1 130 and SBU2 132, respectively.

In submode 2, CC1 134 and CC2 136 are still not connected, while Test Data In (TDI) and Test Data Out (TDO) debug data may be communicated over legacy pins, such as the D+/D− pins 120 of FIG. 1, as indicated at column 304. The SBU1 130 may communicate TMSC/SWDIO data, while the SBU2 132 may communicate TCK/SWDClk data depending on a debug protocol selected.

Data lines of the USB Type-C connector may include Super Speed (SS) data lines, such as the data lines associated with the pins 126 and 128 of FIG. 1. As indicated at 306, 308 and 310, other types of debug trace protocols, such as Mobile Industry Processor Interface (MIPI) parallel trace interface (PTI) protocols including a MIPI PTI clock (CLK), may be used in both Mode 1 304 and mode 2 indicated at 312. In modes 3-7, other types of vendor debug submodes may be supported as indicated at 314. As indicated in the dashed box 316, some of the pins of 126 and 128 may be used to advertise what supported submode is currently in use.

FIG. 4 illustrates a table having pin assignments for an all-in-one port in a secondary debug mode. As discussed above in regard to FIG. 1, entering DSM may be considered entering a primary DSM. A secondary DSM may be entered from the primary DSM. The secondary DSM may provide a wide array of functionality combinations of debug communication as well as other types of data communication such as UFP functional capability, debug class (DbC) or device class (DvC) methodologies as indicated in the table 400 at dashed boxes 402 and 404. Other functionalities, such as audio and video communications may also be enabled according to a desired configuration. In other words, the secondary DSM may enable both debug communications as well as other types of functional communications across a USB Type-C connector, such as the USB Type-C connector 118 of FIG. 1

Figure 5:
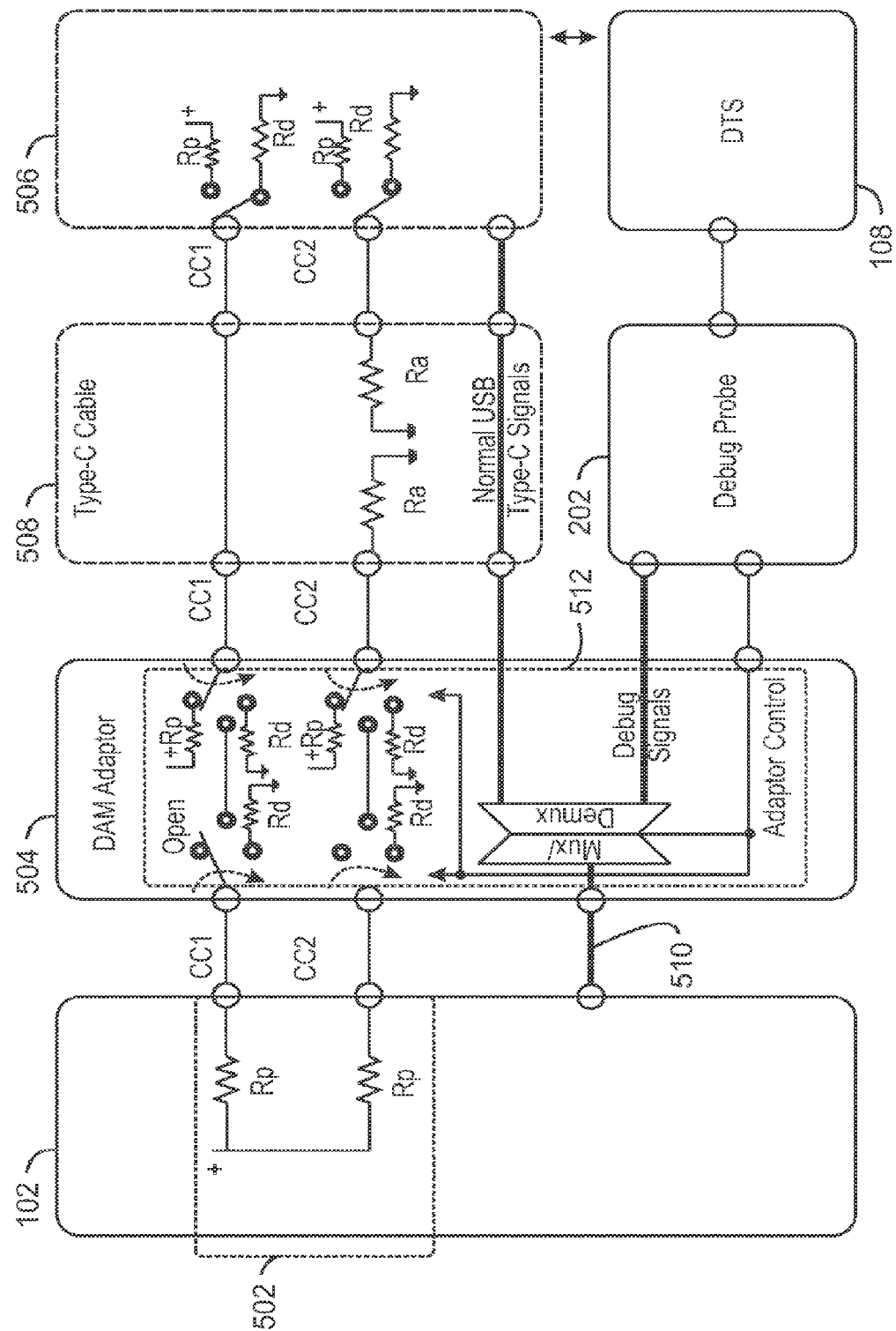
FIG. 5 illustrates an example of a computing system being connected to an adapter to enter a debug mode according to the techniques described herein.

FIG. 5 illustrates an example of a computing system being connected to an adapter to enter a debug mode according to the techniques described herein. In FIG. 5, a computing system 500 may include a computing device and a debug test system (DTS), such as the computing device 102 and the DTS 108 of FIG. 1.

In some cases, the computing device 102 may be a DRP, wherein the computing device 102 may be considered either an UFP or a DFP. As a DRP, one or more resistors (Rp) may be implemented as indicated at 502. A DAM adapter 504 may be used to communicatively couple to the computing device 102. When the DAM adapter 504 is communicatively coupled, a configuration channel, such as the CC1 134 and CC2 136 of FIG. 1, may communicatively present a DFP 506 via a USB Type-C connector cable 508, and the computing device 102 may function in the DRP capacity as an UFP. However, if the DFP 506 is not connected and the configuration channels CC1 134 and CC2 136 are open, the DTS 108 may use other channels, indicated at 510, of the USB Type-C connector of the computing device 102 to communicate debug signals through the DAM adapter 504, and DSM may be entered at the computing device 102. In other words, FIG. 5 illustrates an example configuration using a switching mechanism indicated by the dashed box 512.

Figure 6:
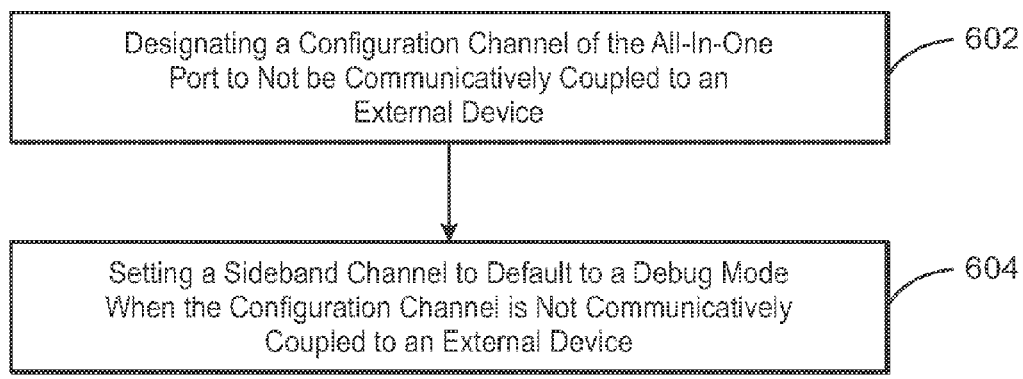
FIG. 6 illustrates a block diagram of a method of entering a debug mode according to techniques described herein.

FIG. 6 illustrates a block diagram of a method of entering a debug mode according to techniques described herein. At block 602, a configuration channel of an all-in-one port is designated to not be communicative coupled to an external device during debug. At block 606, a sideband channel is set to default to a debug mode when the configuration channel is not communicatively coupled to an external device.

The method 600 may include additional features. For example, in some cases, the external device is a debug device. The method 600 may include communicatively coupling the debug device to the sideband use channel, and enabling the debug device to perform debug operations upon identification of the debug device. The method 600 may also include advertising a debug submode that is supported via one or more additional channels of the all-in-one port. In some cases, advertising further includes preventing initialization of the debug device when the debug submodes supported by the apparatus are not supported by the debug device. The debug submode is one of multiple debug submodes, and the multiple debug submodes are each associated with one or more various debug protocols.

In some cases, the debug mode is entered before initialization of an operating system associated with the apparatus. In some cases, the configuration to default to the debug mode is agnostic to whether the all-in-one port is operating as a downward facing port, an upward facing port, or dual role port. Further, the debug mode may be a primary debug mode configured to enable a secondary debug mode to be entered. The second debug mode enables configuration of debug as well as non-debug functionality.

Figure 7:
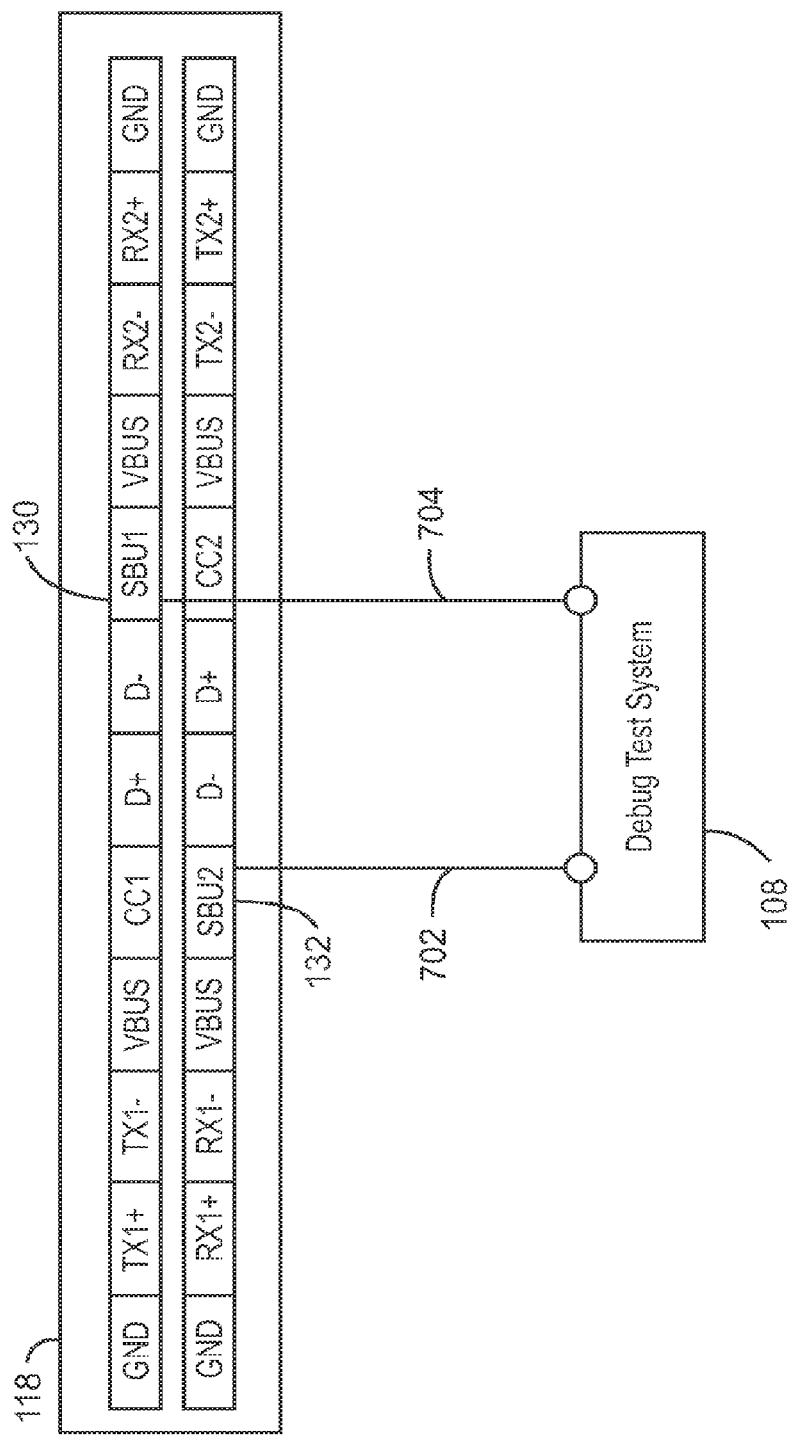
FIG. 7 illustrates an all-in-one port communicatively coupled to a debug device through sideband channels.

FIG. 7 illustrates an all-in-one port communicatively coupled to a debug device through sideband channels. As discussed above, in an open chassis scenario, general purpose input output (GPIO) pins on a computing platform enable a debug device to be communicatively coupled to the GPIO pins for gathering debug trace data. In a closed chassis scenario, a debug device may be limited in a type and kind of pins available for communicative coupling, thereby reducing speed and accessibility of gathering debug trace data. The techniques described herein include various method of communicatively coupling a debug device to a computing device via an all-in-one port to provide relatively higher gathering of debug trace data.

As illustrated in FIG. 7, an all-in-one port having a connector may be configured to communicatively couple to a debug test system, such as the USB Type-C connector 118 communicatively coupled to the debug test system 108 in FIG. 1. In FIG. 7, the communicative coupling between the debug test system 108 and the USB Type-C connector 118 is to sideband use pins, such as the SBU1 130 and the SBU2 132 of FIG. 1. The signal line 702 may be configured to communicate TMSC data, UART_1 data, while the signal line 704 may be configured to communicate TCK data, UART data. The configuration of FIG. 7 may assume that the SBU1 130 and the SBU2 132 are not configured to communicate any other type of data such as display data, audio data, and the like.

Figure 8:
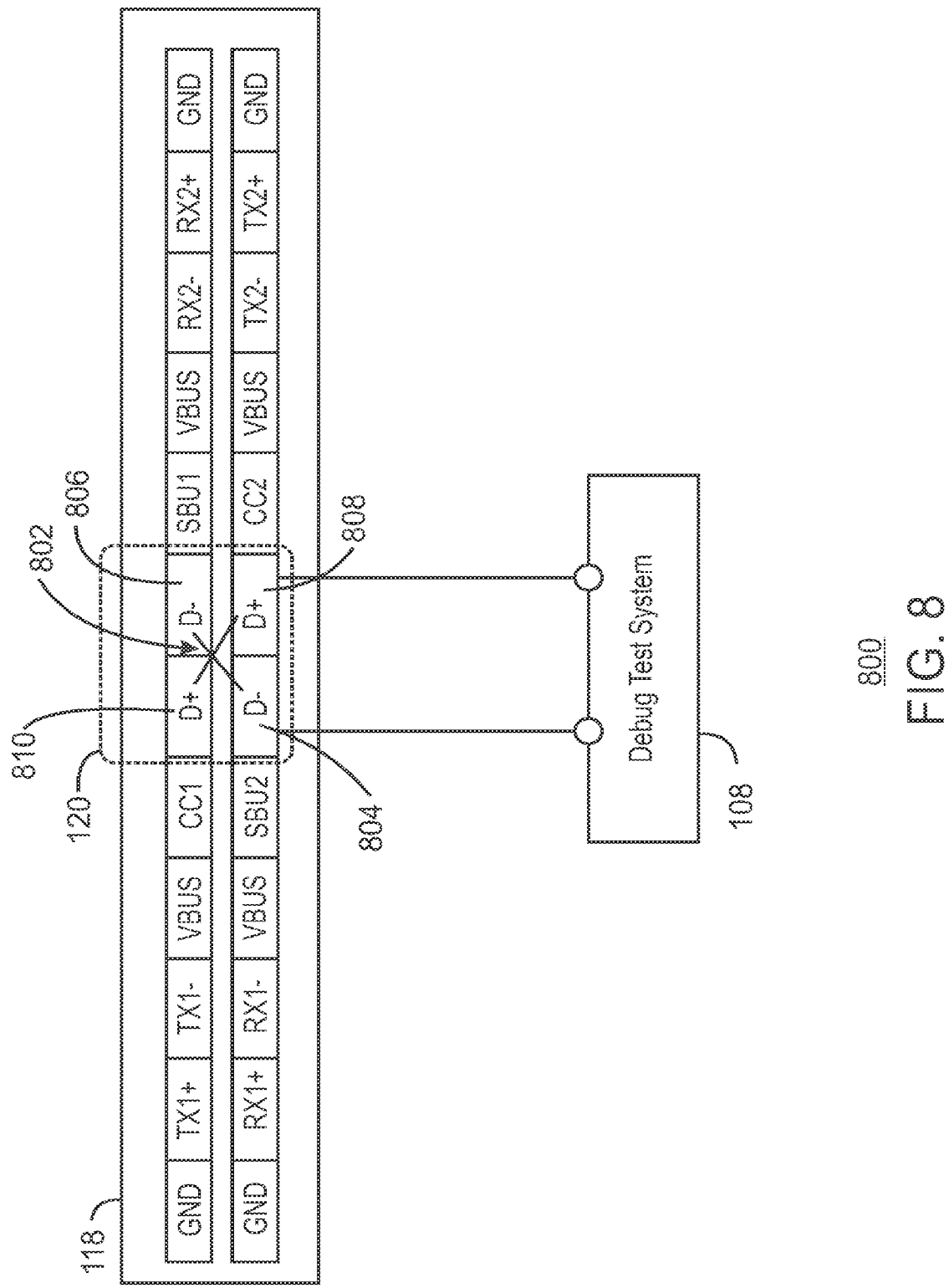
FIG. 8 illustrates an all-in-one port communicatively coupled to a debug device through data channels.

FIG. 8 illustrates an all-in-one port communicatively coupled to a debug device through data channels. Data channels, such as the legacy D+/D− pins 120, may be configured to be communicatively couple the debug test system 108 to USB Type-C connector 118. As illustrated in FIG. 8 by the arrow 802, a bottom row D− pin 804 is coupled to a top row D− pin 806. Similarly, a bottom row D+ pin 808 is coupled to a top row D+ pin 810. In this way, communicatively coupling the debug test system 108 may be agnostic to an orientation of the USB Type-C connector 118 in relation to a USB Type-C cable connecting the debug test system to the USB Type-C connector 118.

Figure 9:
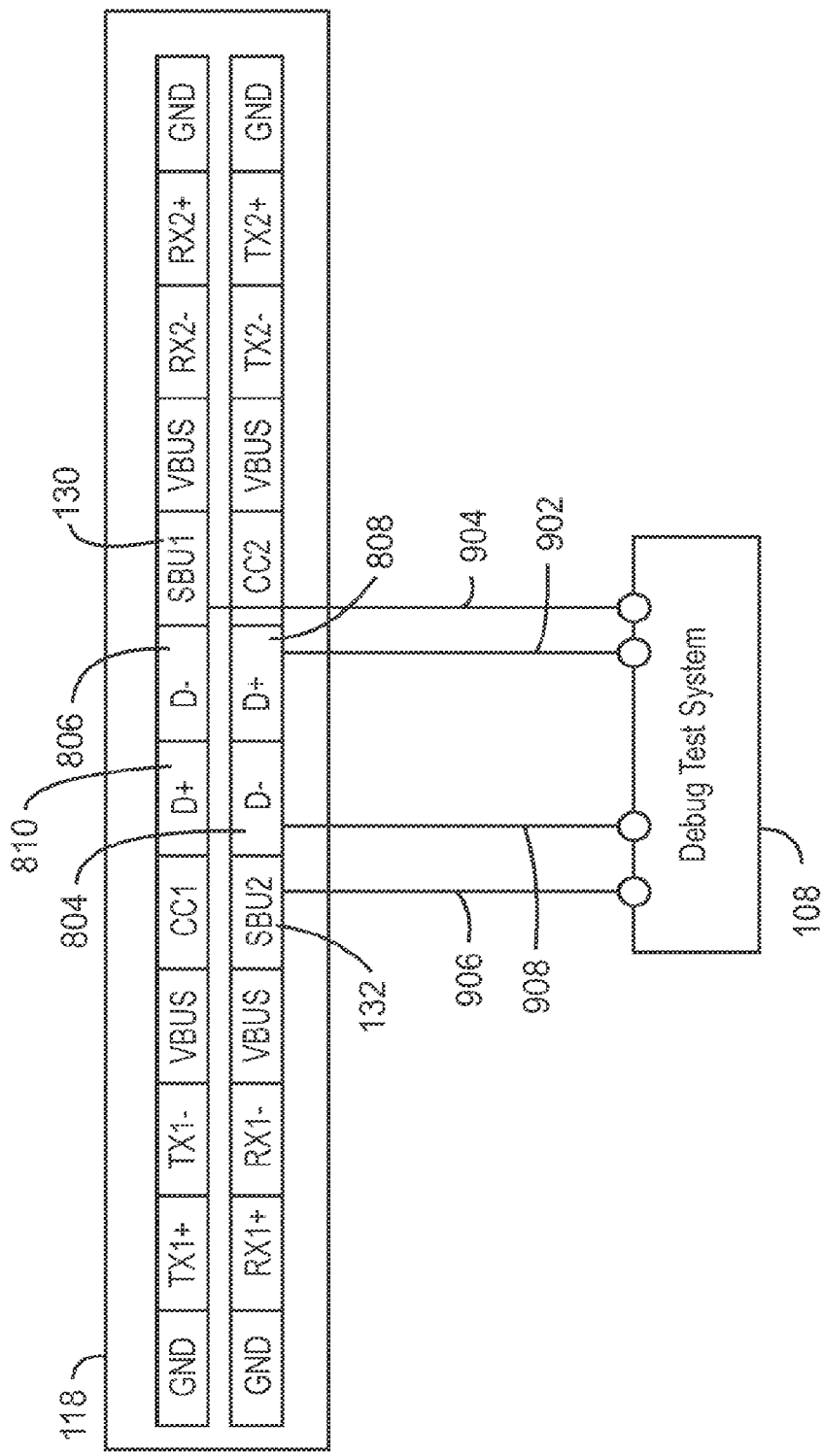
FIG. 9 illustrates an all-in-one port communicatively coupled to a debug device through sideband channels and data channels.

FIG. 9 illustrates an all-in-one port communicatively coupled to a debug device through sideband channels and data channels. In some cases, the debug test system 108 may employ a JTAG TAP controller which uses 4-pins (TDI, TDO, TMS and TCK) with an optional time reset (or TRST) pin. The functionality of TRST pin can also be achieved by using a TMS signal on line 902 communicatively coupled to the lower D+ pin 810 and a TCK signal on line 904 communicatively coupled to SBU1 130. By holding the TMS signal on line 902 high for five or more TCK clocks a reset may be achieved at the debug test system 108. Hence, the TRST pin may not be required to be pinned out. TDI signals may be provided on the line 906 communicatively coupled to SBU2 132 and TDO signals may be provided on line 908 communicatively coupled to lower D− pin 804.

Though FIG. 9 described JTAG functionality being implemented, other types of debug functionality may be implemented. In other words, the implementation of FIG. 9 does not preclude the use of these for UART functionality with the SBU1 130 and SBU2 132 used for UART, thus obtaining simultaneous 4-pin JTAG as well as UART functionality. Further, the implementation example of FIG. 9 does not preclude the use of cJTAG by multiplexing on D+/D− data lines 130 and 132.

Figure 10:
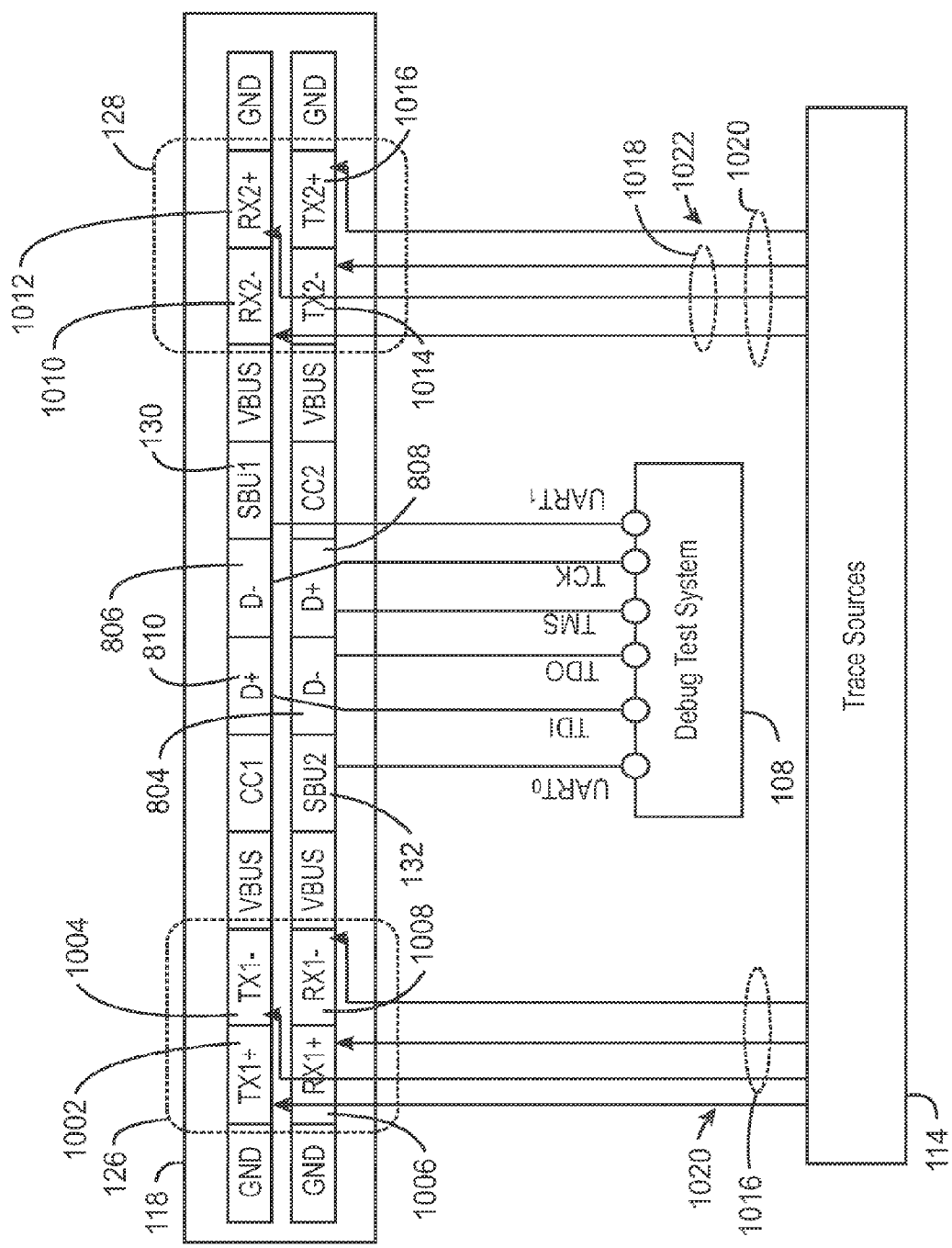
FIG. 10 illustrates an all-in-one port communicatively coupled to a debug device through sideband channels, data channels, and high speed data channels of the all-in-one port.

FIG. 10 illustrates an all-in-one port communicatively coupled to a debug device through sideband channels, data channels, and high speed data channels of the all-in-one port. An all-in-one port may include higher speed port pins than legacy port pins, such as the super speed port pins 126 and 128 in relation to the data pins 120 of the USB Type-C connector 118 discussed above in regard to FIG. 1.

The pins 126 include a top row of transmission pins including TX1+ 1002 and TX1− 1004 forming a differential transmission pin pair. The pins 126 also include bottom row of receiving pins including RX1+ 1006 and RX1− 1008 forming a differential receiving pin pair. The pins 128 include a top row of receiving pins including RX2+ 1010 and RX1− 1010 forming a differential receiving pin pair. The pins 128 also include bottom row of transmission pins including TX2+ 1012 and TX1− 1014 forming a differential transmission pin pair.

FIG. 10 illustrates debug trace outputs may be received via the pins 1002, 1004, 1006, 1008, 1010, 1012, and 1014. Since there are 8-pins (1002, 1004, 1006, 1008, 1010, 1012, and 1014) that can be used, it is possible to send in various different ways, such as two sets of 3-bit debug trace data as indicated at dashed circles 1016 and 1018 and clock signals 1020 and 1022 on each of the Type-C USB3-SS port pins. In another example implementation, 7-bits of debug trace data may be used wherein data line 1020 is used as the clock while data lines 1016, 1018, as well as data line 1020 are used for debug trace data. UART connection to SBU1 130 and SBU2 132 is illustrated, along with 4-pin JTAG pin connectivity to pins 804, 806, 808, and 810, which does not preclude usage of 2-pin cJTAG on either SBU1 130 and SBU2 132 pins or the data pins 804, 806, 808, and 810. In other words, many configurations are contemplated to retrieve trace data from trace sources, such as the trace sources 114 of FIG. 1.

Figure 11:
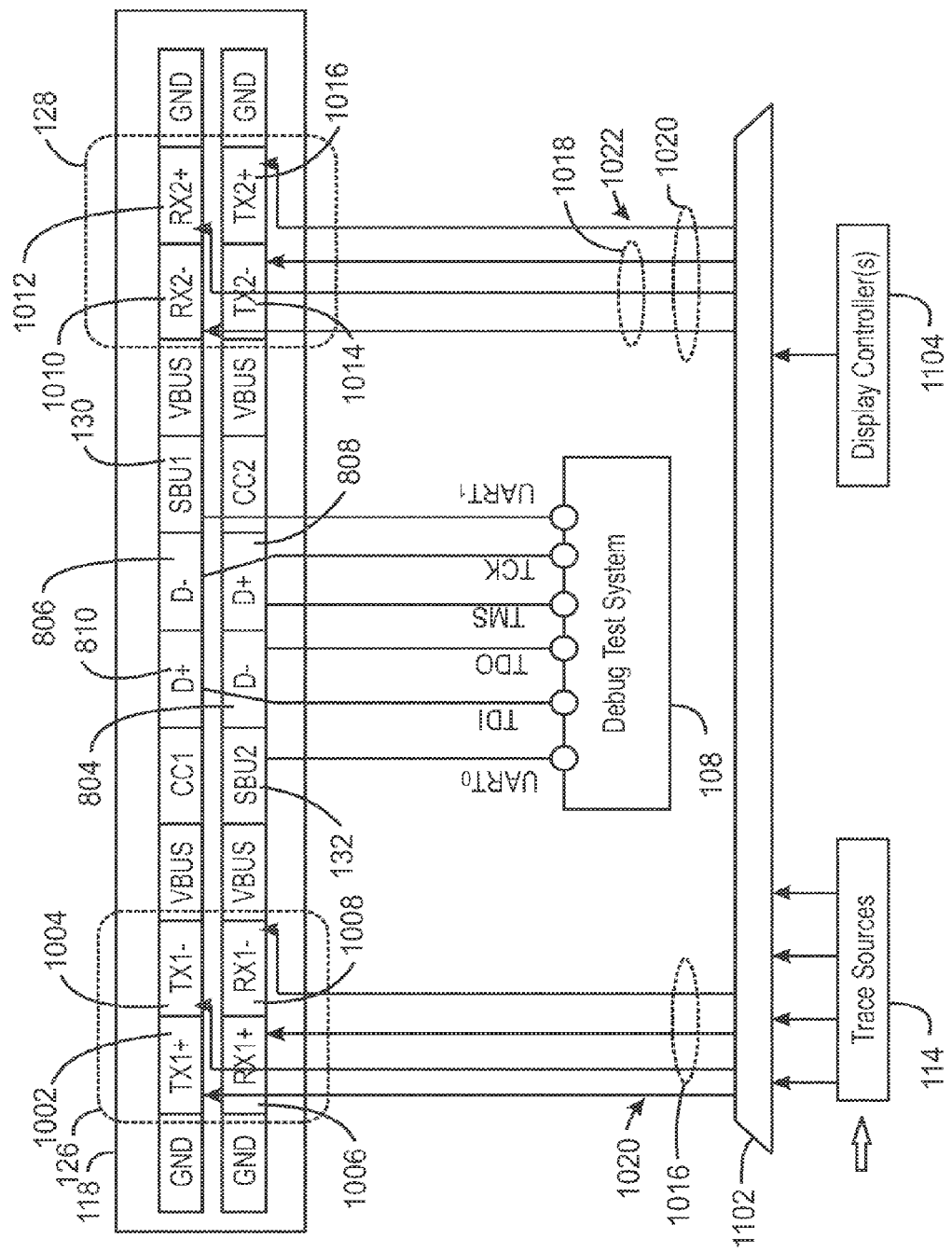
FIG. 11 illustrates an all-in-one port communicatively coupled to a debug device through sideband channels, data channels, and high speed data channels of the all-in-one port, and a selector.

FIG. 11 illustrates an all-in-one port communicatively coupled to a debug device through sideband channels, data channels, and high speed data channels of the all-in-one port, and a selector. In certain applications where USB3-SS ports, such as the ports 126 and 128 are used for display purposes, the USB2-HS pins, such as the data pins 804, 806, 808, and 810 as well as the SBU1 130 and SBU2 132 pins are available for use as debug ports.

FIG. 11 illustrates a scheme 1100 where the USB3-SS ports 126 and 128 are used for functional display usage as well as debug usage by adding a multiplexer 1102 between the trace sources 114 of a computing device, such as the computing device 112 and the ports 126 and 128. The multiplexer 1102 may be configured to operate in a display functional mode wherein outputs of a display controller 1104 are selected and the USB3-SS ports 126 and 128 are used for debug as per debug needs.

To make the scheme 1100 effective for debug, especially for early-boot debug, the multiplexer 1102 may be configured such that a default selection is debug mode and when debug session is completed, then these pins are relinquished and the multiplexer 1102 may be changed to a display mode. Alternatively, control can be given to an operating system (OS) associated with a computing device, such as the computing device 102 of FIG. 1, to do the switching when the OS initializes if debug does not need any combination of the pins 126 and 128, and if there is any display data to be sent via the ports associated with the pins 126 and 128.

The debug trace data from trace sources 114 can be configured to communicate either 1× or 2× or 4× trace data using all 4-differential lanes of the USB Type-C connector. In some cases of display protocol, data rates that can be achieved are about 5 Gigabits per second (Gb/s) per lane resulting in 10 Gb/s for 2× and 20 Gb/s for 4×. With the subsequent generations of display protocol, data rates may double to achieve 10 Gb/s for 1×, 20 Gb/s for 2× and 40 Gb/s for 4× configurations.

Figure 12:
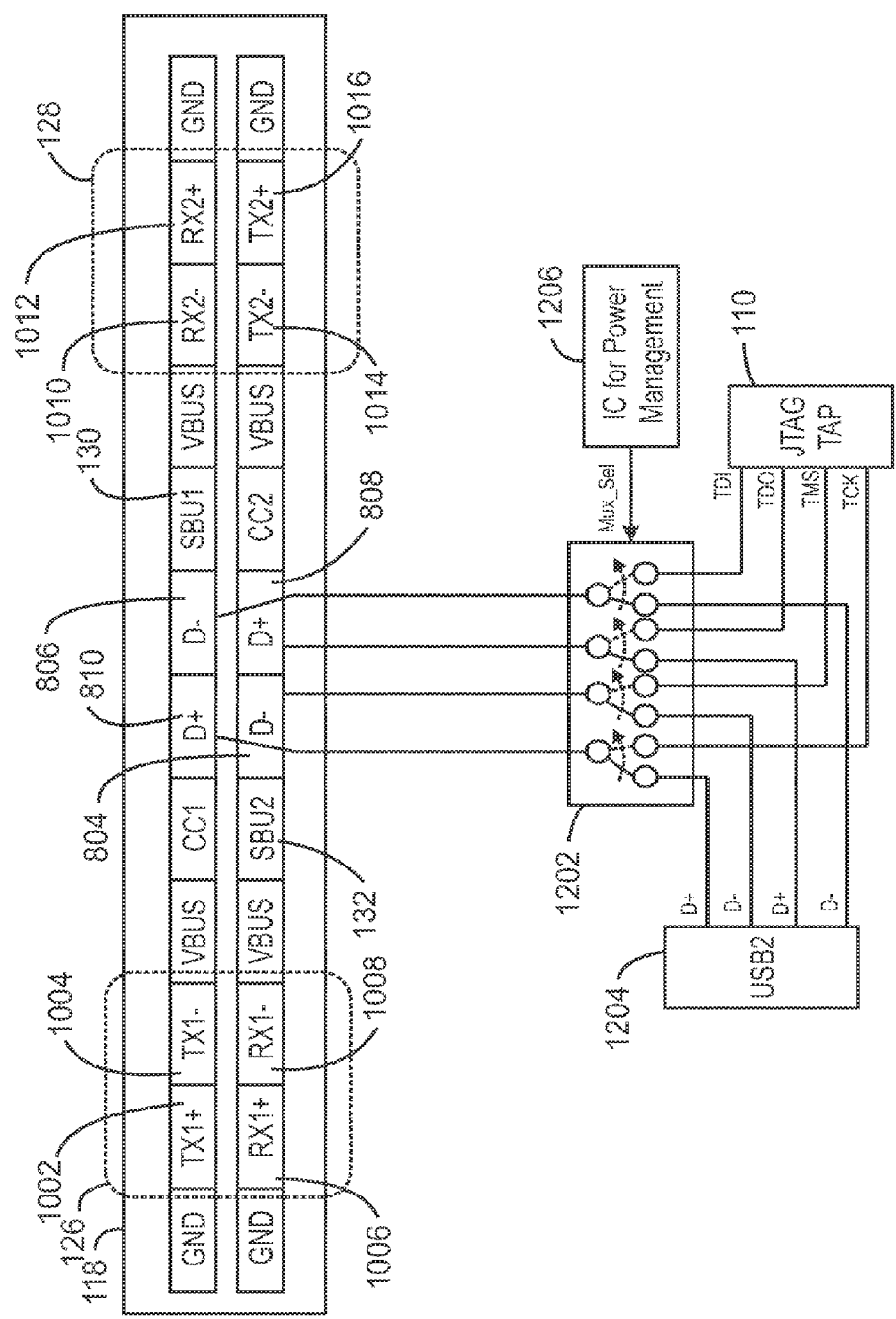
FIG. 12 illustrates an all-in-one port communicatively coupled to a debug device through data channels and a selector.

FIG. 12 illustrates an all-in-one port communicatively coupled to a debug device through data channels and a selector. An allocation 1200 of pins over the USB Type-C connector to use for debug control, such as for multiplexing to obtain 4-pin JTAG, is illustrated. All four D+/D− pins 804, 806, 808, and 810 are used for 4-pin JTAG. Although not shown in FIG. 12, in another arrangement, only two of the four D+/D− pins 804, 806, 808, and 810 are used for 2-pin cJTAG debug. A multiplexer 1202 may have a default selection to select the 4-pin JTAG for early-boot debug from a TAP, such as a JTAG TAP 110 of FIG. 1. When the debug session is complete, the pins 804, 806, 808, and 810 are relinquished for use as USB2-HS pins to communicate with USB2 data sources 1204. Logic for switching can be implemented either in firmware or by an integrated circuit (IC) for power management 1206 as shown in FIG. 12. The multiplexer 1202 can be located either on a platform of the computing device 102 or designed into a SoC and implemented internally.

This does not preclude use of other switching methodologies such as; USB Power Delivery/Vendor Defined Messaging (PD/VDM), MIPI Narrow I/F for Debug and Trace (NIDnT Pin Stimulated) for switching multiplexer 1202. Table given below outlines a few example switching methodologies. Table 1 shows a few of the switching mechanisms used to flip the mux.

Figure 13:
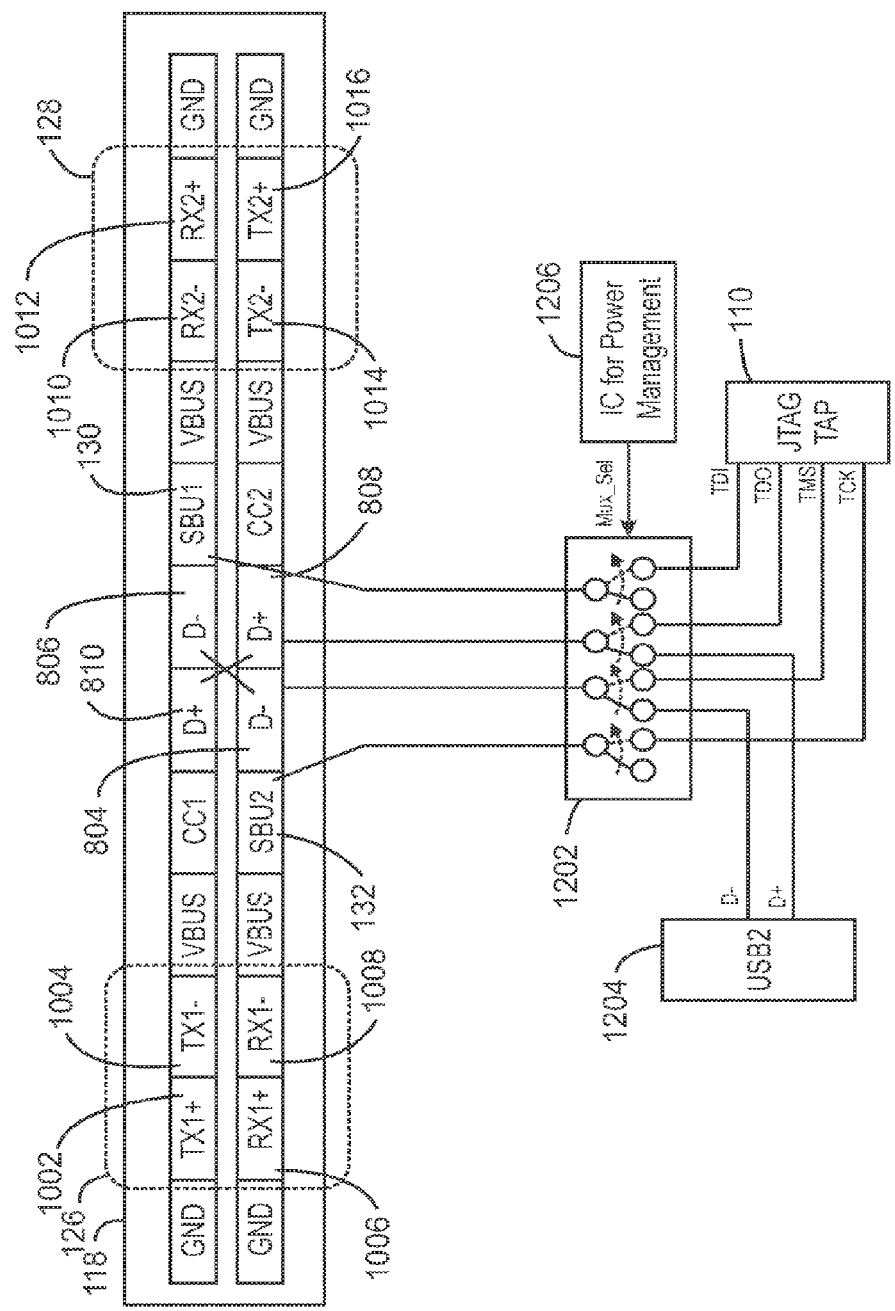
FIG. 13 illustrates an all-in-one port communicatively coupled to a debug device through data channels and a selector in an alternate configuration.

FIG. 13 illustrates an all-in-one port communicatively coupled to a debug device through data channels and a selector in an alternate configuration. One potential issue with the mechanism developed and shown in FIG. 12 is with the use of all the USB2-HS pins which may not be available in all cases. However, in FIG. 13, only two of the four D+/D− pins 804 and 808 are used for 2-pin cJTAG debug. In this scenario, two pins 804 and 808 pins are used for multiplexing with TDO and TMS and the two SBU pins SBU1 130 and SBU2 132 are used for multiplexing with TDI and TCK.

The way the multiplexing has been done has TDO and TMS connected to the D+ and D− respectively which will function correctly even if the Type-C connector is flipped upside-down. The remaining signals TDI and TCK are multiplexed with the SBU pins 130 and 132. To determine if the USB Type-C connector 118 is plugged right-side up or upside-down, an initial boundary scan of an identification code (IDCODE) will result in a correct IDCODE of the JTAG that is being interrogated if the connector is plugged in correctly. If not, reversing the USB Type-C connector 118 may result in the correct IDCODE value on a debug test system. Reversing may be carried out by a user physically unplugging and replugging the USB Type-C connector 118, or by a switch in a debug test system, such as the debug test system 108 of FIG. 1 wherein a signal flip may be performed independent of the user.

Figure 14:
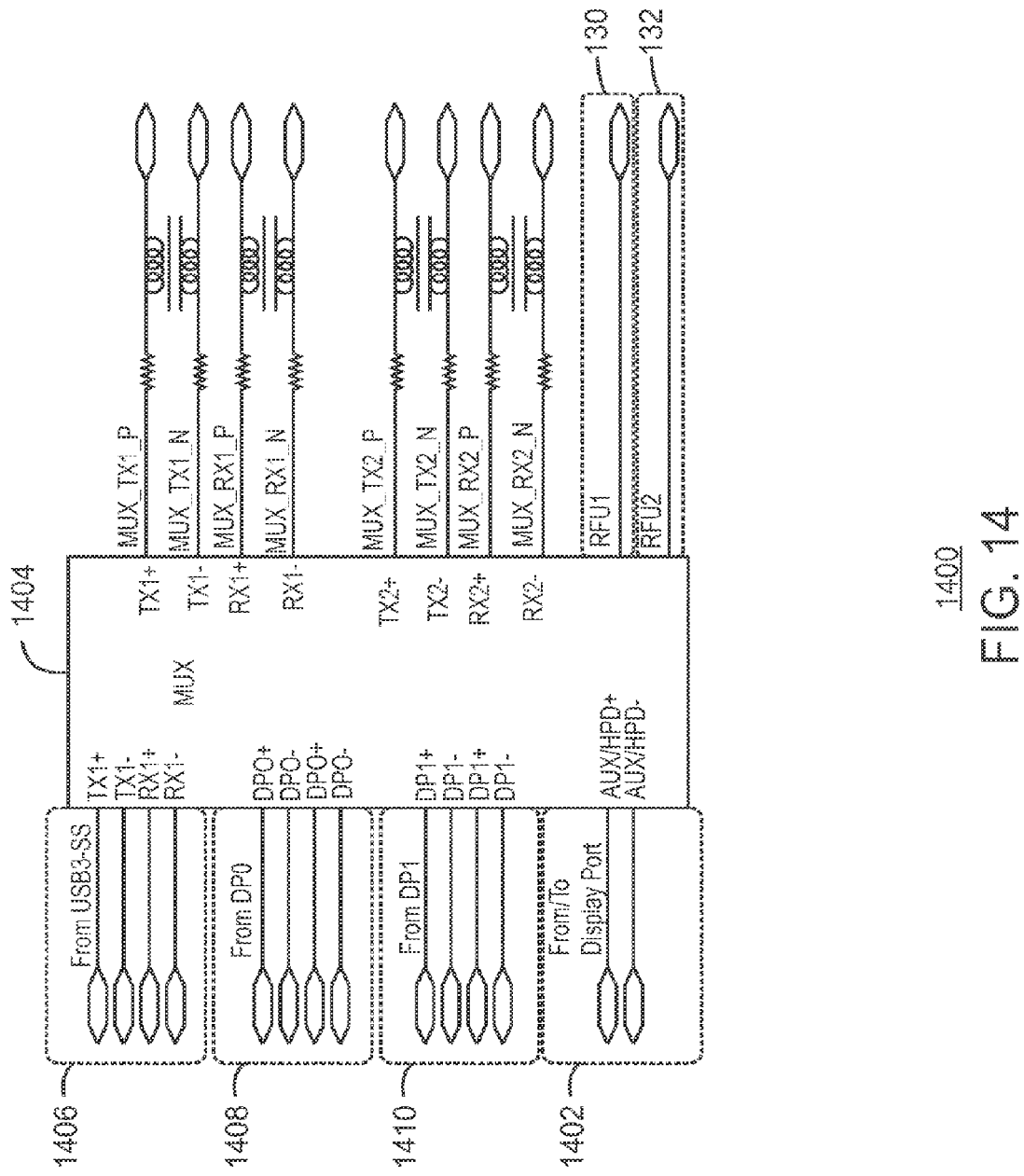
FIG. 14 illustrates an example of a pass-gate mux that may be implemented to enable a single-ended debug scheme.

FIG. 14 illustrates an example of a pass-gate mux that may be implemented to enable a single-ended debug scheme. In some cases, an all-in-one connector, such as the USB Type-C connector 118 of FIG. 1, may be used for other accessory modes such as audio accessory mode or display alternate or guest mode, sideband pins, such as the SBU1 130 and SBU2 132 pins are used for respective audio and display purposes. For example, in display alternate or guest mode, the SBU1 130 and SBU2 132 pins may be used as auxiliary pins to communicate with display logic to configure a panel to function in a correct mode(s), as indicated at 1402.

In addition, the USB Type-C connector 118 may be used in display guest mode by multiplexing one or more of the USB3-SS pins 1002, 1004, 1006, 1008, 1010, 1012, 1014, and 1016 with a display controller output and adding a multiplexer at either the platform level of the computing device 102 or in SoC silicon of the computing device 102. Using a 3:2 multiplexer 1404 at the platform-level or implemented in silicon as shown in FIG. 14, inputs to this multiplexer 1402 comprise USB3-SS port outputs 1406 (outputs of a differential pair of the USB Type-C connector 118 such as 1002, 1004, 1006, 1008) and two DisplayPort outputs (DP0+/− and DP1+/− indicated at 1408 and 1410. The USB Type-C connector 118 may accommodate two ports providing either one USB3-SS output 1406 along with one Display Port (DP) output 1408 or two Display Port (DP) outputs, indicated at 1408 and 1410, respectively. The selection may be done by an 120 controller (not shown) providing inputs to the multiplexer 1402.

Figure 15:
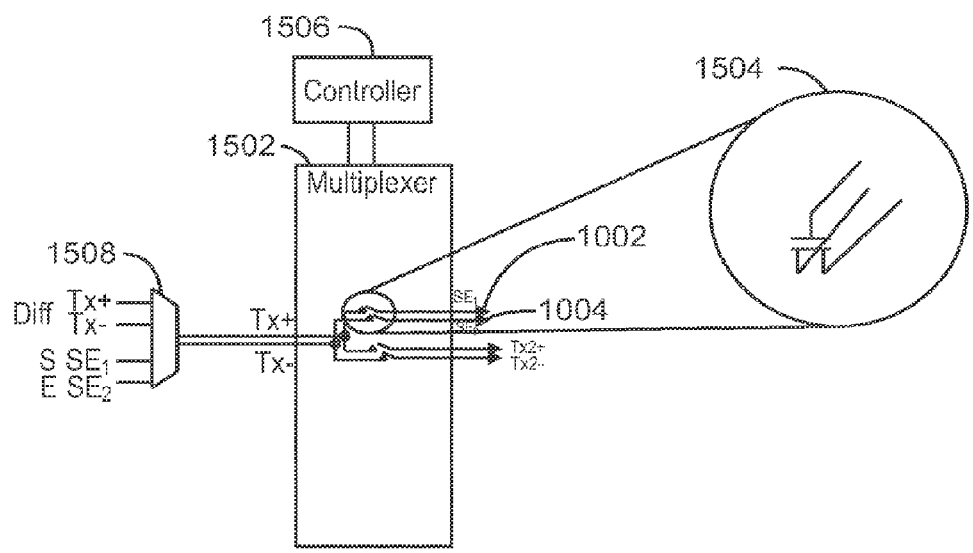
FIG. 15 illustrates an example of a pass-gate mux that may be implemented to enable a single-ended debug scheme.

FIG. 15 illustrates an example of a pass-gate multiplexer that may be implemented to enable a single-ended debug scheme. Some debug methodologies make use of 3/4-pins for debug, such as: Data_in, Clock_in and Data_out (Single-Ended or Differential). One of the requirements of a 3/4-pin custom debug methodologies may be that two of the input pins need to be treated as single-ended (SE) pins and not as differential pins. The difficulty with adding a multiplexer at the platform or in silicon comes if the multiplexer is designed to handle differential signals which will not carry single-ended 2-pins over differential signal ports, such as the differential signal ports 126 and 128 of FIG. 1.

In the configuration 1500, a multiplexer 1502 includes a pass gate switch, indicated in enlargement illustrated in the circle 1504. The pass gate switch 1504 may be transistor having a source and a drain connected between inputs to, and output from, a controller 1506 configured to enable the pass gate switch 1504. The pass-gate switch 1504 treats differential signals as single-ended signals. In other words, the multiplexer 1502 may be configured to treat a SE signal as a differential signal in order to perform custom single ended debug methodologies.

Another multiplexer 1508 may be used to switch between sending either the differential signals or the Single-Ended (SE) custom debug signals. In other words, one of the differential signal line pairs may transmit single ended signals for custom single ended signal methodologies, and other differential signal based methodologies.

Figure 16:
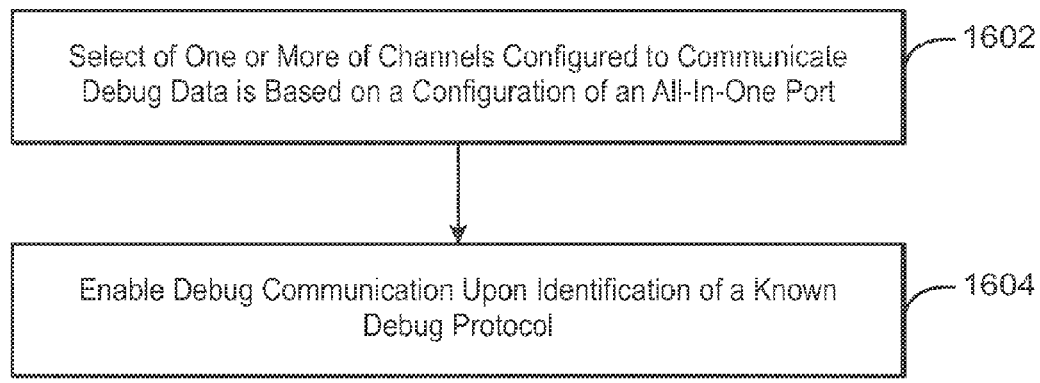
FIG. 16 is a block diagram illustrating a method for communicatively coupling an all-in-one port for debug operations.

FIG. 16 is a block diagram illustrating a method for communicatively coupling an all-in-one port for debug operations. A method 1600 may include selecting one or more channels configured to communicate debug data based on a configuration of an all-in-one, as indicated at block 1602. As discussed above, depending on a given configuration of an all-in-one port, such as a USB-Type C connector, selecting channels, or pins associated with a given channel, may enable debug communication. Debug communication may be enabled only upon identification of a known debug protocol, as indicated at block 1604. Therefore, the techniques described herein may reduce harm caused by unknown and/or unsupported protocols attempting to debug computing devices.

Examples may provide additional support for the techniques described herein. The examples provided below may be combined in any suitable combination.

Example 1 includes an apparatus having an all-in-one port, the all-in-one port, including a configuration channel, and a sideband channel. The sideband channel is to default to a debug mode when the configuration channel is not communicatively coupled to an external device.

Example 2 includes the apparatus of example 1. The external device is a debug device configured to be communicatively coupled to the sideband use channel. This example includes a consent mechanism configured to enable the debug device to perform debug operations upon identification of the debug device by the consent mechanism.

Example 3 includes the apparatus of any combination of examples 1-2. This example includes one or more additional channels of the all-in-one port configured to advertise a debug submode is supported by the apparatus.

Example 4 includes the apparatus of any combination of examples 1-3. The debug submode is one of a plurality of debug submodes, and wherein the plurality of debug submodes are each associated with one or more various debug protocols.

Example 5 includes the apparatus of any combination of examples 1-4. The all-in-one port is a Universal Serial Bus (USB) Type C connector port.

Example 6 includes the apparatus of any combination of examples 1-5. The advertisement is configured to prevent initialization of the debug device when the debug submodes supported by the apparatus are not supported by the debug device.

Example 7 includes the apparatus of any combination of examples 1-6. The debug mode is entered before initialization of an operating system associated with the apparatus.

Example 8 includes the apparatus of any combination of examples 1-7. The configuration to default to the debug mode is agnostic to whether the all-in-one port is operating as a downward facing port, an upward facing port, or dual role port.

Example 9 includes the apparatus of any combination of examples 1-8. The debug mode is a primary debug mode configured to enable a secondary debug mode to be entered.

Example 10 includes the apparatus of any combination of examples 1-9. The second debug mode enables configuration of debug as well as non-debug functionality.

Example 11 is a method of entering debugging for a device having an all-in-one port, comprising, designating a configuration channel of the all-in-one port to not be communicatively coupled to an external device, setting a sideband channel to default to a debug mode when the configuration channel is not communicatively coupled to an external device.

Example 12 includes the method of example 11. The external device is a debug device. This example includes communicatively coupling the debug device to the sideband use channel, enabling the debug device to perform debug operations upon identification of the debug device.

Example 13 includes the method of any combination of examples 11-12. This example includes advertising a debug submode is supported via one or more additional channels of the all-in-one port.

Example 14 includes the method of any combination of examples 11-13. The debug submode is one of a plurality of debug submodes, and wherein the plurality of debug submodes are each associated with one or more various debug protocols.

Example 15 includes the method of any combination of examples 11-14. The all-in-one port is a Universal Serial Bus (USB) Type C connector port.

Example 16 includes the method of any combination of examples 11-15. In this example advertising further may include preventing initialization of the debug device when the debug submodes supported by the apparatus are not supported by the debug device.

Example 17 includes the method of any combination of examples 11-16. The debug mode is entered before initialization of an operating system associated with the apparatus.

Example 18 includes the method of any combination of examples 11-17. In this example defaulting to the debug mode is agnostic to whether the all-in-one port is operating as a downward facing port, an upward facing port, or dual role port.

Example 19 includes the method of any combination of examples 11-18. The debug mode is a primary debug mode. This example includes enabling a secondary debug mode to be entered form the primary debug mode.

Example 20 includes the method of any combination of examples 11-19. The second debug mode enables configuration of debug as well as non-debug functionality.

Example 21 is a system, comprising a debug device, a computing device having an all-in-one port, the all-in-one port. The wireless charging device may include a configuration channel, and a sideband channel. The sideband channel is to default to a debug mode when the configuration channel is not communicatively coupled to the debug device.

Example 22 includes the system of example 21. The debug device is configured to be communicatively coupled to the sideband use channel. This example includes a consent mechanism configured to enable the debug device to perform debug operations upon identification of the debug device by the consent mechanism.

Example 23 includes the system of any combination of examples 21-22. This example includes one or more additional channels of the all-in-one port configured to advertise a debug submode is supported by the apparatus.

Example 24 includes the system of any combination of examples 21-23. The debug submode is one of a plurality of debug submodes, and wherein the plurality of debug submodes are each associated with one or more various debug protocols.

Example 25 includes the system of any combination of examples 21-24. The all-in-one port is a Universal Serial Bus (USB) Type C connector port.

Example 26 includes the system of any combination of examples 21-25. The advertisement is configured to prevent initialization of the debug device when the debug submodes supported by the apparatus are not supported by the debug device.

Example 27 includes the system of any combination of examples 21-26. The debug mode is entered before initialization of an operating system associated with the apparatus.

Example 28 includes the system of any combination of examples 21-27. The configuration to default to the debug mode is agnostic to whether the all-in-one port is operating as a downward facing port, an upward facing port, or dual role port.

Example 29 includes the system of any combination of examples 21-28. The debug mode is a primary debug mode configured to enable a secondary debug mode to be entered.

Example 30 includes the system of any combination of examples 21-29. The second debug mode enables configuration of debug as well as non-debug functionality.

Example 31 is an apparatus having a means for all-in-one port communication, the means for all-in-one port communication. The wireless charging device may include a configuration channel, and a sideband channel. The sideband channel is to default to a debug mode when the configuration channel is not communicatively coupled to an external device.

Example 32 includes the apparatus of example 31. The external device is a debug device configured to be communicatively coupled to the sideband use channel. This example includes a consent mechanism configured to enable the debug device to perform debug operations upon identification of the debug device by the consent mechanism.

Example 33 includes the apparatus of any combination of examples 31-32. This example includes one or more additional channels of the means for all-in-one port communication configured to advertise a debug submode is supported by the apparatus.

Example 34 includes the apparatus of any combination of examples 31-33. The debug submode is one of a plurality of debug submodes, and wherein the plurality of debug submodes are each associated with one or more various debug protocols.

Example 35 includes the apparatus of any combination of examples 31-34. The means for all-in-one port communication is a Universal Serial Bus (USB) Type C connector port.

Example 36 includes the apparatus of any combination of examples 31-35. The advertisement is configured to prevent initialization of the debug device when the debug submodes supported by the apparatus are not supported by the debug device.

Example 37 includes the apparatus of any combination of examples 31-36. The debug mode is entered before initialization of an operating system associated with the apparatus.

Example 38 includes the apparatus of any combination of examples 31-37. The configuration to default to the debug mode is agnostic to whether the means for all-in-one port communication is operating as a downward facing port, an upward facing port, or dual role port.

Example 39 includes the apparatus of any combination of examples 31-38. The debug mode is a primary debug mode configured to enable a secondary debug mode to be entered.

Example 40 includes the apparatus of any combination of examples 31-39. The second debug mode enables configuration of debug as well as non-debug functionality.

Example 41 is a method of entering debugging for a device having a means for all-in-one port communication, comprising, designating a configuration channel of the means for all-in-one port communication to not be communicatively coupled to an external device, setting a sideband channel to default to a debug mode when the configuration channel is not communicatively coupled to an external device.

Example 42 includes the method of example 41. The external device is a debug device. This example includes communicatively coupling the debug device to the sideband use channel, enabling the debug device to perform debug operations upon identification of the debug device.

Example 43 includes the method of any combination of examples 41-42. This example includes advertising a debug submode is supported via one or more additional channels of the means for all-in-one port communication.

Example 44 includes the method of any combination of examples 41-43. The debug submode is one of a plurality of debug submodes, and wherein the plurality of debug submodes are each associated with one or more various debug protocols.

Example 45 includes the method of any combination of examples 41-44. The means for all-in-one port communication is a Universal Serial Bus (USB) Type C connector port.

Example 46 includes the method of any combination of examples 41-45. In this example advertising further may include preventing initialization of the debug device when the debug submodes supported by the apparatus are not supported by the debug device.

Example 47 includes the method of any combination of examples 41-46. The debug mode is entered before initialization of an operating system associated with the apparatus.

Example 48 includes the method of any combination of examples 41-47. In this example defaulting to the debug mode is agnostic to whether the means for all-in-one port communication is operating as a downward facing port, an upward facing port, or dual role port.

Example 49 includes the method of any combination of examples 41-48. The debug mode is a primary debug mode. This example includes enabling a secondary debug mode to be entered form the primary debug mode.

Example 50 includes the method of any combination of examples 41-49. The second debug mode enables configuration of debug as well as non-debug functionality.

Example 51 includes an apparatus having an all-in-one port, the all-in-one port, comprising a selection of one or more channels among a plurality of channels of the all-in-one port to communicate debug data. In this example the selection of the one or more channels configured to communicate debug data is based on a configuration of the all-in-one port for communication of non-debug data, and wherein the selection of one or more channels are configured to enable debug communication upon identification of a known debug protocol.

Example 52 includes the apparatus of example 51. The known debug protocol is presented by a debug device configured to be communicatively coupled to the apparatus via the selection of one or more channels.

Example 53 includes the apparatus of any combination of examples 51-52. The selection of one or more channels may include a sideband channel of the all-in-one port.

Example 54 includes the apparatus of any combination of examples 51-53. The all-in-one port is a Universal Serial Bus (USB) Type C connector port.

Example 55 includes the apparatus of any combination of examples 51-54. The selection of one or more channels further may include a non-flippable USB differential pair channel configured communicate debug trace data.

Example 56 includes the apparatus of any combination of examples 51-55. This example includes a selection mechanism to switch between a configuration for communicating the debug trace data and a configuration for communicating the non-debug data.

Example 57 includes the apparatus of any combination of examples 51-56. The selection mechanism may include a multiplexer having a pass gate configured to treat differential signals as single ended signals for a single ended debug methodology.

Example 58 includes the apparatus of any combination of examples 51-57. The selection mechanism is initiated by a power management unit associated with the apparatus.

Example 59 includes the apparatus of any combination of examples 51-58. The selection of one or more channels may include a sideband channel. The all-in-one port is a Universal Serial Bus (USB) Type C connector port. The selection of the one or more channels further may include two non-flippable USB differential pair channels that are configured communicate Test Data Out (TDO) data and Test Mode Select (TMS) data. In this example pins of the two non-flippable USB differential pair channels having the same polarity are communicatively coupled to each other.

Example 60 includes the apparatus of any combination of examples 51-59. The sideband channel may include a first sideband pin configured to communicate Test Data In (TDI) data, and a second sideband pin configured to communicate Test Clock (TCK) data.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An apparatus having an all-in-one port, the all-in-one port, comprising:
    a configuration channel; and
    a sideband channel, wherein the sideband channel is to default to a debug mode when the configuration channel is not communicatively coupled to an external device.

2. The apparatus of claim 1, wherein the external device is a debug device configured to be communicatively coupled to the sideband use channel, further comprising a consent mechanism configured to enable the debug device to perform debug operations upon identification of the debug device by the consent mechanism.

3. The apparatus of claim 2, further comprising one or more additional channels of the all-in-one port configured to advertise a debug submode is supported by the apparatus.

4. The apparatus of claim 3, wherein the debug submode is one of a plurality of debug submodes, and wherein the plurality of debug submodes are each associated with one or more various debug protocols.

5. The apparatus of claim 3, wherein the all-in-one port is a Universal Serial Bus (USB) Type C connector port.

6. The apparatus of claim 3, wherein the advertisement is configured to prevent initialization of the debug device when the debug submodes supported by the apparatus are not supported by the debug device.

7. The apparatus of claim 1, wherein the debug mode is entered before initialization of an operating system associated with the apparatus.

8. The apparatus of claim 1, wherein the configuration to default to the debug mode is agnostic to whether the all-in-one port is operating as a downward facing port, an upward facing port, or dual role port.

9. The apparatus of claim 1, wherein the debug mode is a primary debug mode configured to enable a secondary debug mode to be entered.

10. The apparatus of claim 1, wherein the second debug mode enables configuration of debug as well as non-debug functionality.

11. A method of entering debugging for a device having an all-in-one port, comprising;
    designating a configuration channel of the all-in-one port to not be communicatively coupled to an external device;
    setting a sideband channel to default to a debug mode when the configuration channel is not communicatively coupled to an external device.

12. The method of claim 11, wherein the external device is a debug device, further comprising:
    communicatively coupling the debug device to the sideband use channel;
    enabling the debug device to perform debug operations upon identification of the debug device.

13. The method of claim 12, further comprising advertising a debug submode is supported via one or more additional channels of the all-in-one port.

14. The method of claim 13, wherein the debug submode is one of a plurality of debug submodes, and wherein the plurality of debug submodes are each associated with one or more various debug protocols.

15. The method of claim 13, wherein the all-in-one port is a Universal Serial Bus (USB) Type C connector port.

16. The method of claim 13, wherein advertising further comprises preventing initialization of the debug device when the debug submodes supported by the apparatus are not supported by the debug device.

17. The method of claim 11, wherein the debug mode is entered before initialization of an operating system associated with the apparatus.

18. The method of claim 11, wherein defaulting to the debug mode is agnostic to whether the all-in-one port is operating as a downward facing port, an upward facing port, or dual role port.

19. The method of claim 11, wherein the debug mode is a primary debug mode, further comprising enabling a secondary debug mode to be entered form the primary debug mode.

20. The method of claim 11, wherein the second debug mode enables configuration of debug as well as non-debug functionality.

21. A system, comprising
    a debug device;
    a computing device having an all-in-one port, the all-in-one port, comprising:
        a configuration channel; and a sideband channel, wherein the sideband channel is to default to a debug mode when the configuration channel is not communicatively coupled to the debug device.

22. The system of claim 21, wherein the debug device is configured to be communicatively coupled to the sideband use channel, further comprising a consent mechanism configured to enable the debug device to perform debug operations upon identification of the debug device by the consent mechanism.

23. The system of claim 22, wherein the all-in-one port is a Universal Serial Bus (USB) Type C connector port, further comprising one or more additional channels of the USB Type C port configured to advertise a debug submode associated with one or more various debug protocols is supported by the apparatus.

24. The system of claim 23, wherein the advertisement is configured to prevent initialization of the debug device when the debug submodes supported by the apparatus are not supported by the debug device.

25. The system of claim 21, wherein the configuration to default to the debug mode is agnostic to whether the all-in-one port is operating as a downward facing port, an upward facing port, or dual role port.

\* \* \* \* \*